(12) United States Patent
Jin et al.

(10) Patent No.: US 11,892,619 B2
(45) Date of Patent: Feb. 6, 2024

(54) MEMS DEVICE WITH A THREE-LAYER COMB ACTUATOR STRUCTURE AND A TWO-LAYER HINGE

(71) Applicant: Lumentum Operations LLC, Milpitas, CA (US)

(72) Inventors: Wenlin Jin, Ottawa (CA); Stephen Bagnald, Ottawa (CA); Gonzalo Wills, Ottawa (CA)

(73) Assignee: Lumentum Operations LLC, San Jose, CA (US)

( * ) Notice: Subject to any disclaimer, the term of this patent is extended or adjusted under 35 U.S.C. 154(b) by 779 days.

(21) Appl. No.: 16/673,180

(22) Filed: Nov. 4, 2019

(65) Prior Publication Data

US 2021/0063727 A1 Mar. 4, 2021

Related U.S. Application Data

(60) Provisional application No. 62/895,814, filed on Sep. 4, 2019.

(51) Int. Cl.
*G02B 26/08* (2006.01)
*B81B 3/00* (2006.01)
*H02N 1/00* (2006.01)

(52) U.S. Cl.
CPC ........ *G02B 26/0841* (2013.01); *B81B 3/0021* (2013.01); *H02N 1/008* (2013.01); *B81B 2201/033* (2013.01); *B81B 2201/034* (2013.01); *B81B 2201/042* (2013.01)

(58) Field of Classification Search
CPC .......... G02B 26/0841; G02B 26/101; B81B 3/0021; B81B 2201/033; B81B 2201/034; B81B 2201/042; B81B 2203/0109; B81B 2203/0154; B81B 3/0048; B81B 5/00; B81B 2201/04; H02N 1/008

USPC ....................................... 359/199.2

See application file for complete search history.

(56) References Cited

U.S. PATENT DOCUMENTS

| | | | |
|---|---|---|---|
| 5,652,671 A | 7/1997 | Knipe et al. | |
| 6,360,035 B1* | 3/2002 | Hurst, Jr. | G02B 26/085 |
| 10,509,198 B1* | 12/2019 | Zhou | G01S 7/4817 |
| 2015/0234176 A1* | 8/2015 | Zhou | G06F 16/958 |
| | | | 359/221.2 |
| 2017/0005257 A1* | 1/2017 | Uchino | H10N 30/87 |
| 2020/0182976 A1* | 6/2020 | Zhou | G02B 26/105 |
| 2020/0195169 A1* | 6/2020 | Zhou | B81B 3/0043 |
| 2021/0063727 A1* | 3/2021 | Jin | B81B 3/0021 |

FOREIGN PATENT DOCUMENTS

CN 1117108 A 2/1996

* cited by examiner

*Primary Examiner* — John K Kim
(74) *Attorney, Agent, or Firm* — Harrity & Harrity, LLP

(57) ABSTRACT

A micro-sized optical device may comprise a mirror suspended on a set of hinges that are mounted to the substrate and that are configured to tilt the mirror about an axis, wherein a hinge of the set of hinges is a two-layer structure with a pivot point that aligns with a mass center of the mirror; and a three-layer comb actuator structure associated with the hinge of the set of hinges, wherein the three-layer comb actuator structure includes a rotor comb actuator, a first stator comb actuator, and a second stator comb actuator.

20 Claims, 4 Drawing Sheets

MEMS DEVICE WITH A THREE-LAYER COMB ACTUATOR STRUCTURE AND A TWO-LAYER HINGE

RELATED APPLICATION(S)

This application claims priority to U.S. Provisional Patent Application No. 62/895,814, filed on Sep. 4, 2019, and entitled "DESIGN APPROACH FOR TWO-DIMENSIONAL MEMS WITH LARGE MIRROR, WIDE TILT ANGLE, AND HIGH RESONANT FREQUENCY," the content of which is incorporated by reference herein in its entirety.

TECHNICAL FIELD

The present disclosure relates to a micro-electro-mechanical system (MEMS) device that includes a mirror utilizing a multi-layer set of comb actuators and/or a multi-layer hinge to tilt a mirror of the MEMS device, and in particular to a MEMS device utilizing a three-layer set of comb actuators and/or a two layer hinge to tilt a mirror of the MEMS device.

BACKGROUND

A micro-electro-mechanical system (MEMS) device is a micro-sized mechanical structure that may include a mirror for reflecting light. When the MEMS device is actuated, the mirror may be tilted about an axis, which may cause an optical beam that was falling upon the mirror and reflecting in one direction to fall upon the mirror and reflect in a different direction.

SUMMARY

According to some implementations, a micro-electromechanical (MEMs) device may comprise a substrate; a first layer adjacent to the substrate, a second layer adjacent to the first layer, and a third layer adjacent to the second layer; a gimbal suspended on a set of first hinges that are mounted to the substrate and that are configured to tilt the gimbal about a first axis, wherein the gimbal forms part of the second layer; a first comb actuator structure associated with a first hinge of the set of first hinges, wherein the first comb actuator structure includes a rotor comb actuator that forms part of the second layer and two stator comb actuators that respectively form part of the first layer and part of the third layer; a mirror suspended on a set of second hinges that are mounted to the gimbal and that are configured to tilt the mirror about a second axis, wherein the mirror forms part of the third layer, wherein the first axis is different than the second axis, wherein the mirror is attached to the gimbal via the set of second hinges to allow the mirror to tilt about the first axis when the gimbal tilts about the first axis; and a second comb actuator structure associated with a second hinge of the set of second hinges, wherein the second comb actuator structure includes an additional rotor comb actuator that forms part of the third layer and two additional stator comb actuators that respectively form part of the first layer and part of the second layer.

According to some implementations, a micro-sized mechanical structure may comprise a substrate; a gimbal suspended on a set of first hinges that are mounted to the substrate and that are configured to tilt the gimbal about a first axis; a three-layer first comb actuator structure associated with a first hinge of the set of first hinges; a mirror suspended on a set of second hinges that are mounted to the gimbal and that are configured to tilt the mirror about a second axis; and a three-layer second comb actuator structure associated with a second hinge of the set of second hinges.

According to some implementations, a micro-sized optical device may comprise a mirror suspended on a set of hinges that are mounted to the substrate and that are configured to tilt the mirror about an axis, wherein a hinge of the set of hinges is a two-layer structure with a pivot point that aligns with a mass center of the mirror; and a three-layer comb actuator structure associated with the hinge of the set of hinges, wherein the three-layer comb actuator structure includes a rotor comb actuator, a first stator comb actuator, and a second stator comb actuator.

DETAILED DESCRIPTION

Figure 1:
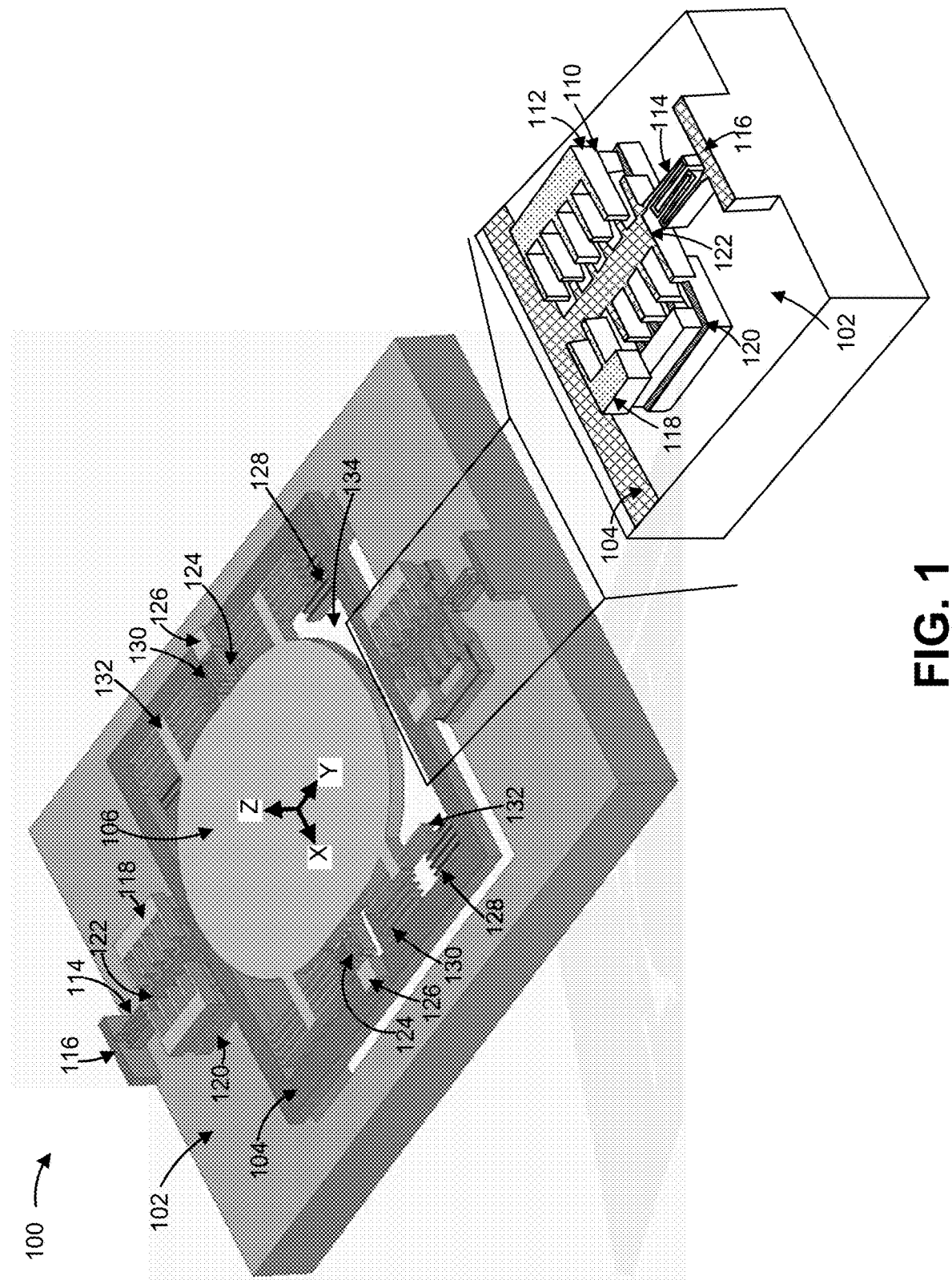
FIG. 1 is a diagram of an example implementation described herein.

The following detailed description of example implementations refers to the accompanying drawings. The same reference numbers in different drawings may identify the same or similar elements.

A light detection and ranging (LIDAR) system detects an object by illuminating the object with an optical beam (e.g., a laser beam) and measuring characteristics of a reflected optical beam. A vehicle, such as a semiautonomous or fully autonomous vehicle, may use a LIDAR system to detect objects (e.g., other vehicles, pedestrians, road debris, and/or the like) in a path of the vehicle. A typical LIDAR system includes a beam deflection unit that deflects both projected optical beams and reflected optical beams. However, the beam deflection unit spins in place and is therefore subject to mechanical wear and tear (e.g., from friction, abrasion, and/or the like). Accordingly, for many applications, such as autonomous vehicle applications, a more robust solid-state LIDAR system is desired.

In some cases, a solid-state LIDAR system may use one or more MEMS devices to deflect projected optical beams and reflected optical beams. For such a LIDAR system to provide a long range and wide field-of-view, a MEMS device of the LIDAR system should include a large mirror that can provide wide deflection angles. Moreover, the MEMS device needs to have a high resonant frequency to be resistant to operational vibrations (e.g., that result from operation of a vehicle that includes a LIDAR system). For example, a vehicle may be subject to vibrations created by the vehicle travelling on a road, airflow, and/or the like that propagate to a MEMS device of a LIDAR system included in the vehicle. In many cases, the MEMS device uses a two-layer comb actuator structure (e.g., comprising a single stator comb actuator and a single rotor comb actuator) to provide a driving torque to tilt the mirror on a hinge of the MEMS device. However, the two-layer comb actuator structure may not provide enough driving torque to tilt the mirror and/or maintain a deflection angle of the mirror when the MEMS device is subject to operational vibrations, which inhibits the functionality of the MEMS device and/or the solid-state LIDAR system. Additionally, the hinge may have a pivot point that is not aligned with a mass center of the mirror, which may allow operational vibrations to produce competing torque that causes the mirror to tilt away from a preferred deflection angle and that further inhibits the functionality of the MEMS device and/or the solid-state LIDAR system.

Some implementations described herein provide a MEMS device with a three-layer comb actuator structure to provide increased driving torque. This allows the MEMS device to tilt a mirror of the MEMS device and/or maintain a deflection angle of the mirror when the MEMS device is subject to operational vibrations. Further, in some implementations, the MEMS device may include a two-layer hinge for tilting the mirror such that the two-layer hinge is designed to have a pivot point that is aligned with a mass center of the mirror. This reduces or removes vibration induced torque that may affect the deflection angle of the mirror. Accordingly, some implementations described herein provide a MEMS device that is more resistant to operational vibrations than traditional MEMS devices, which facilitates more robust functionality of the MEMS device and/or the solid-state LIDAR system.

FIG. 1 is a diagram of an example MEMS device 100 described herein. As shown in FIG. 1, MEMS device 100 may include a substrate 102, a gimbal 104, and/or a mirror 106. The MEMS device may be a micro-sized optical device configured to deflect optical beams via the mirror 106. In some implementations, one or more layers may be adjacent to the substrate 102 (e.g., formed in layers on the substrate 102, grown in layers on the substrate 102, deposited in layers on the substrate 102, and/or the like), such as a first layer 108, a second layer 110, and a third layer 112. The one or more layers may be silicon-based layers.

In some implementations, the gimbal 104 may form part of at least one layer of the one or more layers, such as the second layer 110. For example, as shown in FIG. 1, the gimbal 104 may form some or all of the second layer 110 (e.g., the second layer 110 may be shaped, etched, formed, and/or the like to create the gimbal 104). In some implementations, the mirror 106 may form part of at least one layer of the one or more layers, such as the third layer 112. For example, as shown in FIG. 1, the mirror 106 may form some or all of the third layer 112 (e.g., the third layer 112 may be shaped, etched, formed, and/or the like to create the mirror 106). The mirror 106 may be coated with a reflective coating (e.g., a metallic reflective material, such as gold) for reflecting optical beams.

In some implementations, the gimbal 104 may be suspended via one or more hinges 114 (multiple hinges are referred to as "hinges 114" and a single hinge is referred to as "hinge 114"). The one or more hinges 114 may be configured to tilt the gimbal 104 along an axis (e.g., the y-axis shown in FIG. 1). In some implementations, a hinge 114 may be composed of multiple layers, such as the first layer 108 and the second layer 110. Further description regarding the one or more hinges 114 is provided herein in relation to FIG. 2. The one or more hinges 114 may be mounted to the substrate 102 via one or more respective anchors 116 (multiple anchors are referred to as "anchors 116" and a single anchor is referred to as "anchor 116"). An anchor 116 may be composed of one or more layers, such as the first layer 108 and the second layer 110. The one or more anchors 116 may be configured to stabilize the gimbal 104 and/or the one or more hinges 114 as the gimbal 104 tilts on the one or more hinges 114 (e.g., about the y-axis).

In some implementations, one or more comb actuator structures may be respectively associated with the one or more hinges 114. A comb actuator structure may be configured to generate an electrostatic torque to tilt the gimbal 104 (e.g., about the y-axis on the one or more hinges 114). Moreover, the comb actuator structure may include one or more comb actuators, such as a plurality of stator comb actuators and/or a rotor comb actuator. For example, a comb actuator structure may include a stator comb actuator 118, a stator comb actuator 120, and/or a rotor comb actuator 122. The one or more comb actuators may form part of different respective layers of the MEMS device 100. For example, the stator comb actuator 118 may form part of the third layer 112, the stator comb actuator 120 may form part of the first layer 108, and the rotor comb actuator 122 may form part of the second layer 110 (e.g., the layer formed in part by the gimbal 104). In some implementations, the rotor comb actuator 122 may be attached to the gimbal 104 and the stator comb actuator 118, and the stator comb actuator 120 may be secured (e.g., attached directly or via one or more layers) to the substrate 102 (e.g., as shown in FIG. 1).

In some implementations, each of the one or more comb actuators may include a plurality of teeth for engaging with a plurality of teeth of another of the comb actuators. For example, the rotor comb actuator 122 may include a plurality of teeth to engage with a plurality of teeth of the stator comb actuator 118 and/or a plurality of teeth of the stator comb actuator 120. When a voltage is respectively applied to the stator comb actuator 118 and/or the stator comb actuator 120, a voltage difference between the rotor comb actuator 122 and the stator comb actuator 118 and/or the stator comb actuator 120 creates an electrostatic field that causes (e.g., pulls) the plurality of teeth of the rotor comb actuator 122 to engage with the plurality of teeth of the stator comb actuator 118 and/or the plurality of teeth of the stator comb actuator 120. The electrostatic field may generate electrostatic torque that causes the gimbal 104 to tilt (e.g., about the y-axis on the one or more hinges 114).

Moreover, the electrostatic field may cause a linear electrostatic force in a first direction (e.g., a positive direction along the z-axis shown in FIG. 1) due to the plurality of teeth of the rotor comb actuator 122 engaging with the plurality of teeth of the stator comb actuator 118 (e.g., the stator comb actuator 118 pulls the rotor comb actuator 122 toward the stator comb actuator 118) and may cause a linear electrostatic force in a second direction (e.g., a negative direction along the z-axis) due to the plurality of teeth of the rotor comb actuator 122 engaging with the plurality of teeth of the stator comb actuator 120 (e.g., the stator comb actuator 120 pulls the rotor comb actuator 122 toward the stator comb actuator 120). In some implementations, the magnitude of the linear electrostatic force in the first direction may be equal to (or substantially equal to, within a suitable tolerance) the linear electrostatic force in the second direction. Therefore, the linear electrostatic force in the first direction may cancel out the linear electrostatic force in the second direction, resulting in a net linear electrostatic force of zero. Accordingly, because the electrostatic field may generate electrostatic torque but not linear electrostatic force, the comb actuator structure that includes the one or more comb actuators may be referred to as a "pure torque" comb actuator structure.

In some implementations, the mirror 106 may be suspended via one or more hinges 124 (multiple hinges are referred to as "hinges 124" and a single hinge is referred to as "hinge 124"). The one or more hinges 124 may be configured to tilt the mirror 106 along an axis (e.g., the x-axis shown in FIG. 1). A hinge 124 may be composed of multiple layers, such as the second layer 110 and the third layer 112. Further description regarding the one or more hinges 124 is provided herein in relation to FIG. 2. The one or more hinges 124 may be mounted to the gimbal 104 via one or more respective anchors 126. An anchor 126 may be composed of one or more layers, such as the second layer 110 and the third layer 112. The one or more anchors 126 may be configured to stabilize the mirror 106 and/or the one or more hinges 124 as the mirror 106 tilts on the one or more hinges 124 (e.g., about the x-axis). Further, the one or more anchors 126 may be configured to attach the mirror 106 to the gimbal 104 to allow the mirror 106 to tilt with the gimbal 104 when the gimbal 104 tilts on the one or more hinges 114 (e.g., about the y-axis). In this way, the MEMS device may be configured to tilt the mirror 106 in two dimensions (e.g., about the x-axis and/or the y-axis), where tilting in a first dimension is independent of tilting in a second dimension.

In some implementations, one or more comb actuator structures may be respectively associated with the one or more hinges 124. A comb actuator structure may be configured to generate an electrostatic torque to tilt the mirror 106 (e.g., about the x-axis on the one or more hinges 124). Moreover, the comb actuator structure may include one or more comb actuators, such as a plurality of stator comb actuators and/or a rotor comb actuator. For example, a comb actuator structure may include a stator comb actuator 128, a stator comb actuator 130, and/or a rotor comb actuator 132. The one or more comb actuators may form part of different respective layers of the MEMS device 100. For example, the stator comb actuator 128 may form part of the first layer 108, the stator comb actuator 130 may form part of the second layer 110, and the rotor comb actuator 132 may form part of the third layer 112 (e.g., the layer formed in part by the mirror 106). Such a comb actuator structure, with a rotor comb actuator and two separate, adjacent layers of rotor comb actuators, may be referred to as a two-stage-stator comb actuator structure. In some implementations, the rotor comb actuator 132 may be attached to the mirror 106 and the stator comb actuator 128, and the stator comb actuator 130 may be secured (e.g., attached directly or via one or more layers) to the gimbal 104 (e.g., as shown in FIG. 1).

In some implementations, each of the one or more comb actuators of the two-stage-stator comb actuator structure may include a plurality of teeth for engaging with a plurality of teeth of another of the comb actuators. For example, the rotor comb actuator 132 may include a plurality of teeth to engage with a plurality of teeth of the stator comb actuator 128 and/or a plurality of teeth of the stator comb actuator 130. When a voltage is respectively applied to the stator comb actuator 128 and/or the stator comb actuator 130, a voltage difference between the rotor comb actuator 132 and the stator comb actuator 128 and/or the stator comb actuator 130 creates an electrostatic field that causes (e.g., pulls) the plurality of teeth of the rotor comb actuator 132 to engage with the plurality of teeth of the stator comb actuator 128 and/or the plurality of teeth of the stator comb actuator 130. The electrostatic field may generate electrostatic torque that causes the mirror 106 to tilt (e.g., about the x-axis on the one or more hinges 124).

In some implementations, the first layer 108 may be bonded to the second layer 110 via an insulating material, such as an oxide layer, to electrically isolate the first layer 108 from the second layer 110. Similarly, the second layer 110 may be bonded to the third layer 112 via an insulating material, such as an oxide layer, to electrically isolate the second layer 110 from the third layer 112. Moreover, the first layer 108, the second layer 110, and/or the third layer 112 may each be respectively associated with a different electrode, which may allow a different voltage to be applied to each layer at the same time. This may allow greater control of tilting the gimbal 104 and/or the mirror 106.

For example, in the pure torque comb actuator structure described above, a first voltage may be applied to the stator comb actuator 118 and a second voltage may be applied to the stator comb actuator 120, which may allow for more fine-grained control of the electrostatic torque created by the rotor comb actuator 122 engaging with the stator comb actuator 118 and/or the stator comb actuator 120 that causes the gimbal 104 and/or the mirror 106 to tilt (e.g., about the y-axis on the one or more hinges 114). In another example, in the two-stage-stator comb actuator structure described above, a first voltage may be applied to the stator comb actuator 128 and a second voltage may be applied to the stator comb actuator 130, which may allow for more fine-grained control of the electrostatic torque created by the rotor comb actuator 132 engaging with the stator comb actuator 128 and the stator comb actuator 130 that causes the mirror 106 to tilt (e.g., about the x-axis on the one or more hinges 124).

In some implementations, the substrate 102 may include a substrate opening 134. The substrate opening 134 may allow the gimbal 104 and/or the mirror 106 to tilt about an axis (e.g., the y-axis) and/or the mirror to tilt about another axis (e.g., the x-axis).

While some implementations described herein are directed to a MEMS device 100 that can tilt a mirror 106 in two dimensions by utilizing two sets of different comb actuator structures (e.g., a set of pure torque comb actuator structures or a set of two-stage-stator comb actuator structures), implementations also include a MEMS device 100 that can tilt a mirror 106 in just a single dimension utilizing either a set of pure torque comb actuator structures or a set of two-stage-stator comb actuator structures. For example, the mirror 106 may be suspended via one or more hinges that are mounted to the substrate and that are configured to tilt the mirror 106 along an axis (e.g., the y-axis, the x-axis, or another axis) and one or more comb actuator structures (e.g., one or more pure torque comb actuator structures or one or more two-stage-stator comb actuator structures) may be configured to tilt the mirror 106 along the axis (e.g., on the one or more hinges), in a similar manner as described herein.

As indicated above, FIG. 1 is provided merely as one or more examples. Other examples may differ from what is described with regard to FIG. 1.

Figure 2:
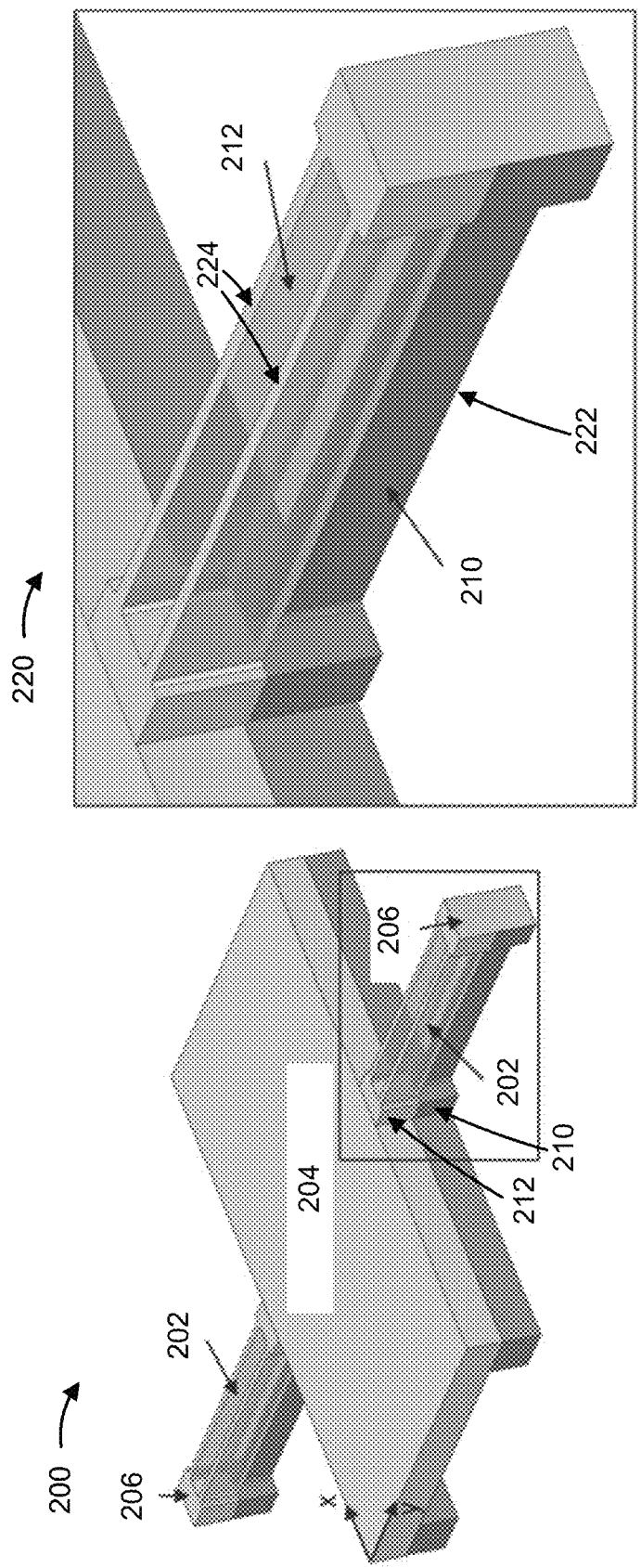
FIG. 2 is a diagram of example hinges from an example implementation herein.

FIG. 2 includes diagrams 200 and 220 of example hinges (e.g., hinge 114, hinge 124, and/or the like) described herein.

As shown in FIG. 2, and by diagram 200, one or more hinges 202 (e.g., one or more hinges 114, one or more hinges 124, and/or the like, wherein multiple hinges are referred to as "hinges 202" and a single hinge is referred to as "hinge 202") may be attached to a moving structure 204 (e.g., the gimbal 104, the mirror 106, and/or the like). A hinge 202 may be mounted to another structure (e.g., the substrate 102, the gimbal 104, and/or the like) via an anchor 206 (e.g., the anchor 116, the anchor 126, and/or the like). The hinge 202, the moving structure 204, and/or the anchor 206 may each be composed of multiple layers, such as a first layer 210 and a second layer 212. The hinge 202 may be configured to tilt the moving structure 204 around a pivot point of the hinge 202 along an axis (e.g., the y-axis shown in FIG. 2).

As shown in FIG. 2, and by diagram 220, the hinge 202 may be a two-layer structure comprising the first layer 210 and the second layer 212, where the first layer 210 comprises a beam structure of one or more beams and the second layer 212 comprises a beam structure of one or more beams. For example, as shown in FIG. 2, the first layer 210 may comprise a single beam structure 222 and the second layer 212 may comprise a double beam structure 224. The beam structure of the second layer 212 may provide the twisting stiffness required to tilt the moving structure 204 and the beam structure of the first layer 210 may cause the pivot point of the hinge 202 to be shifted (e.g., from the second layer 212 to the first layer 210) to align with the mass center of the moving structure 204. In this way, the mass center of the moving structure 204 may align with the pivot point of the hinge 202, which may increase an operational vibration resistance of the hinge 202 and/or the moving structure 204.

As indicated above, FIG. 2 is provided merely as one or more examples. Other examples may differ from what is described with regard to FIG. 2.

Figure 3:
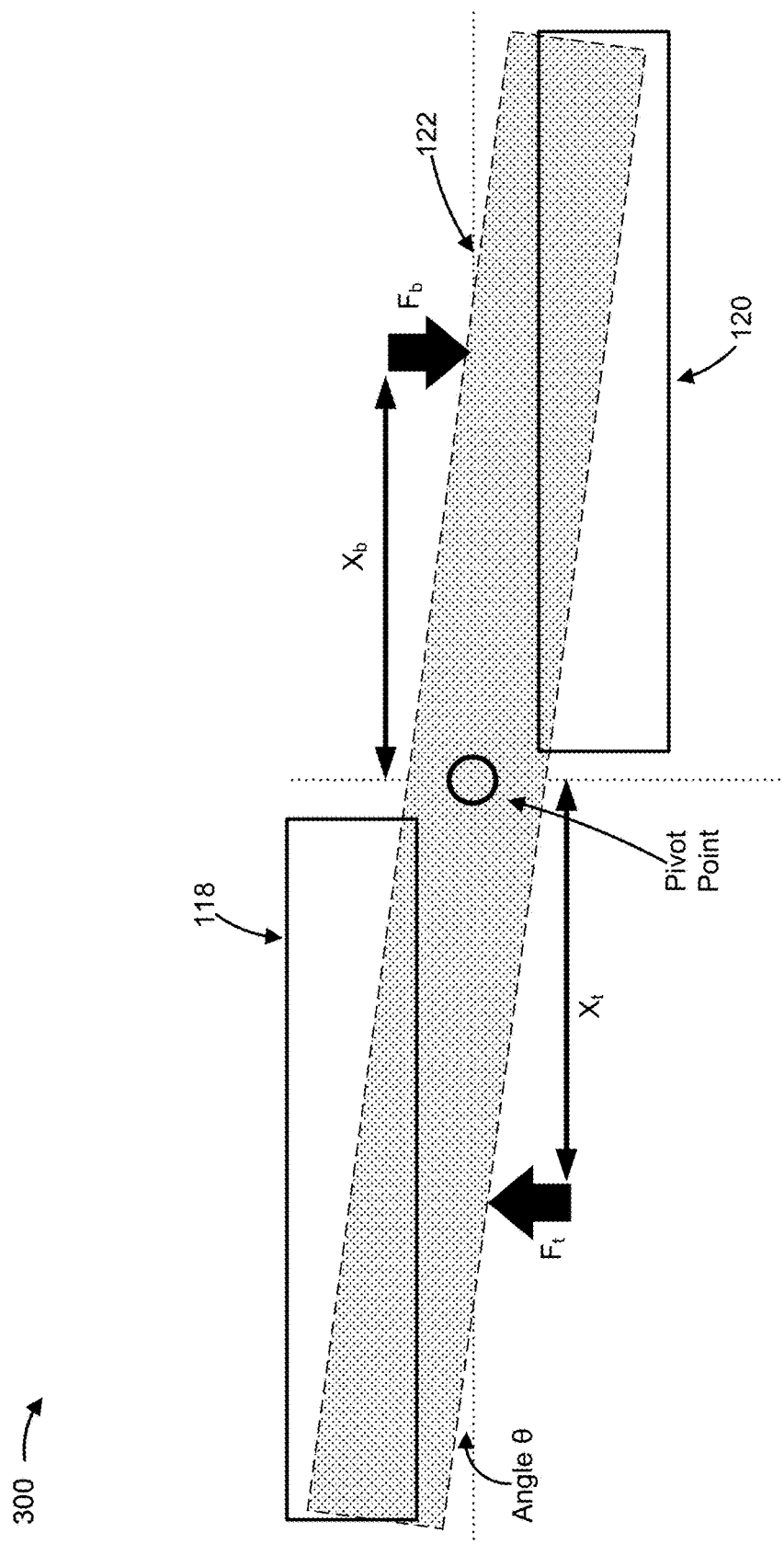
FIG. 3 is a diagram of a comb actuator structure from an example implementation described herein.

FIG. 3 includes a diagram 300 illustrating a side view of a pure torque comb actuator structure as described herein. As shown in FIG. 3, tilting about a pivot point at a tilt angle θ, the rotor comb actuator 122 may engage with the stator comb actuator 118 (e.g., the stator comb actuator 118 pulls the rotor comb actuator 122 toward the stator comb actuator 118) and may engage with the stator comb actuator 120 (e.g., the stator comb actuator 120 pulls the rotor comb actuator 122 toward the stator comb actuator 120). Engagement of the rotor comb actuator 122 with the stator comb actuator 118 may cause a linear electrostatic force in a first direction with a magnitude of $F_t$. Engagement of the rotor comb actuator 122 with the stator comb actuator 120 may cause a linear electrostatic force in a second direction with a magnitude of $F_b$. Therefore, in some implementations (e.g., when the stator comb actuator 118 has a same thickness as the stator comb actuator 120, a same voltage is applied to the stator comb actuator 118 and the stator comb actuator 120, and/or the like), $F_t$ and $F_b$ may be equal but opposite in magnitude and direction and therefore cancel each other out, resulting in a net linear electrostatic force of zero on the pure torque comb actuator structure.

Moreover, in some implementations (e.g., when the stator comb actuator 118 has a same thickness and a same length as the stator comb actuator 120, a same voltage is applied to the stator comb actuator 118 and the stator comb actuator 120, and/or the like), the pure torque comb actuator structure generates twice the electrostatic torque as would be generated using a single stator comb actuator (e.g., just the stator comb actuator 118 or just the stator comb actuator 120). For example, engagement of the rotor comb actuator 122 with the stator comb actuator 118 may generate an electrostatic torque $T_t$, where $T_t = F_t \times X_t$ and $X_t$ is the median length of the stator comb actuator 118. Similarly, engagement of the rotor comb actuator 122 with the stator comb actuator 120 may generate an electrostatic torque $T_b$, where $T_b = F_b \times X_b$ and $X_b$ is the median length of the stator comb actuator 120. Accordingly, the electrostatic torque generated by the pure torque comb actuator structure is $T_{total}$, where $T_{total} = T_t + T_b$. When $F_b = F_t$ and $X_b = X_t$, then $T_t = T_b$, such that $T_{total} = 2 \times T_t$ or $T_{total} = 2 \times T_b$.

As indicated above, FIG. 3 is provided merely as one or more examples. Other examples may differ from what is described with regard to FIG. 3.

Figure 4:
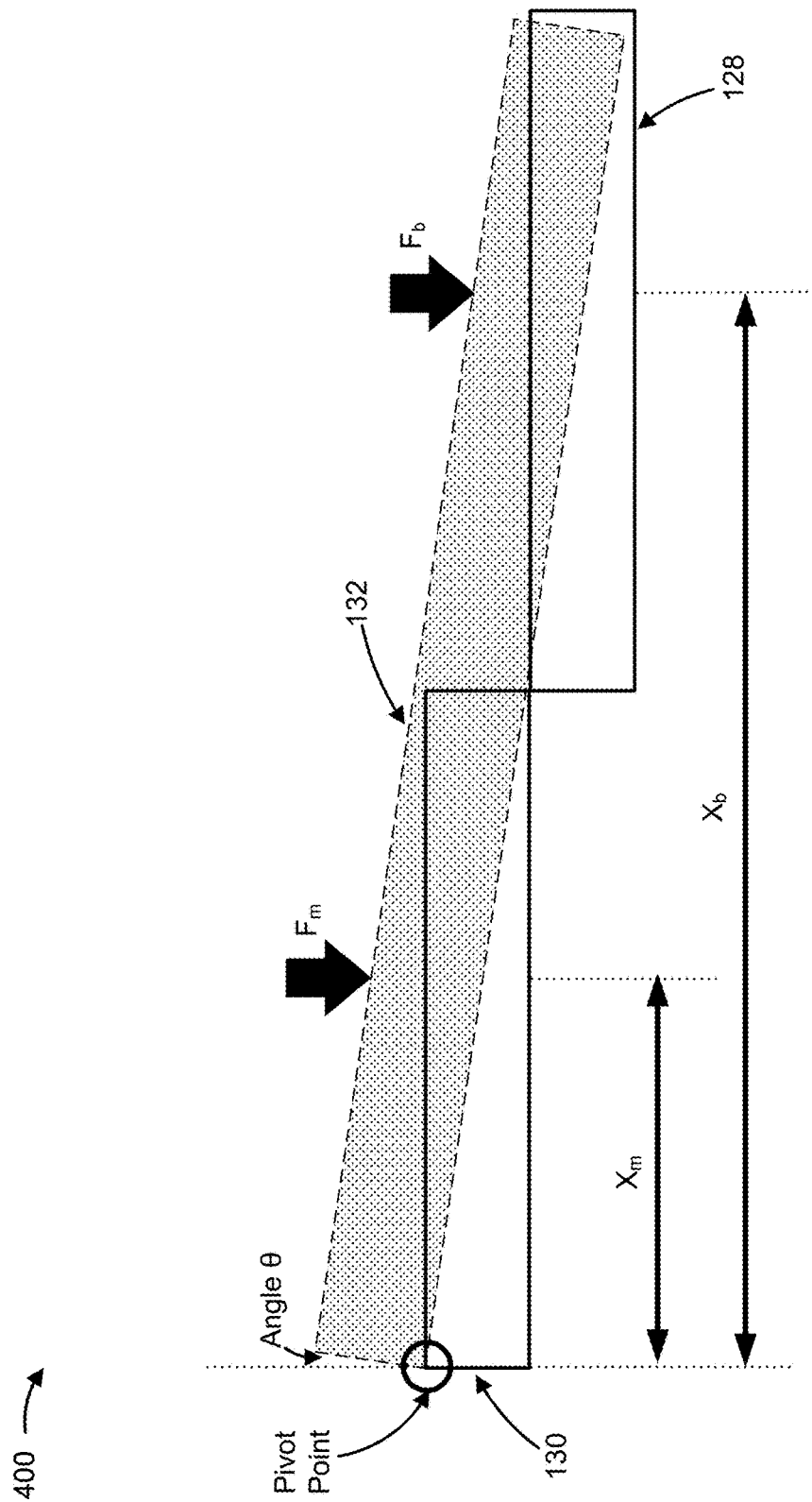
FIG. 4 is a diagram of a comb actuator structure from an example implementation described herein.

FIG. 4 includes a diagram 400 illustrating a side view of a two-stage-stator comb actuator structure as described herein. As shown in FIG. 4, tilting about a pivot point at a tilt angle θ, the rotor comb actuator 132 may engage with the stator comb actuator 128 (e.g., the stator comb actuator 128 pulls the rotor comb actuator 132 toward the stator comb actuator 128) and may engage with the stator comb actuator 130 (e.g., the stator comb actuator 130 pulls the rotor comb actuator 132 toward the stator comb actuator 130). Engagement of the rotor comb actuator 132 with the stator comb actuator 128 may cause a linear electrostatic force in a direction with a magnitude of $F_m$. Engagement of the rotor comb actuator 132 with the stator comb actuator 130 may cause a linear electrostatic force in the same direction with a magnitude of $F_b$. In some implementations (e.g., when the stator comb actuator 128 has a same thickness and/or a same length as the stator comb actuator 130, a same voltage is applied to the stator comb actuator 128 and the stator comb actuator 130, and/or the like) the two-stage-stator comb actuator structure generates four times the electrostatic torque as would be generated using a single stator comb actuator (e.g., just the stator comb actuator 130).

For example, engagement of the rotor comb actuator 132 with the stator comb actuator 130 may generate an electrostatic torque $T_m$, where $T_m = F_m \times X_m$ and $X_m$ is the median length of the stator comb actuator 130. Similarly, engagement of the rotor comb actuator 132 with the stator comb actuator 128 may generate an electrostatic torque $T_b$, where $T_b = F_b \times X_b$ and $X_b$ is the median length of the stator comb actuator 128. Accordingly, the electrostatic torque generated by the two-stage-stator comb actuator structure is $T_{total}$, where $T_{total} = T_m + T_b$. When $F_b = F_t$ and $X_b = 3 \times X_m$, then $T_b = 3 \times T_m$, such that $T_{total} = T_m + (3 \times T_m)$ or $T_{total} = 4 \times T_m$.

As indicated above, FIG. 4 is provided merely as one or more examples. Other examples may differ from what is described with regard to FIG. 3.

The foregoing disclosure provides illustration and description, but is not intended to be exhaustive or to limit the implementations to the precise forms disclosed. Modifications and variations may be made in light of the above disclosure or may be acquired from practice of the implementations.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A micro-sized mechanical structure comprising:
   a substrate;
   a first layer adjacent to the substrate, a second layer adjacent to the first layer, and a third layer adjacent to the second layer;
   a gimbal suspended on a set of first hinges that are mounted to the substrate and that are configured to tilt the gimbal about a first axis, wherein the gimbal forms part of the second layer;
   a first comb actuator structure associated with a first hinge of the set of first hinges, wherein the first comb actuator structure includes a rotor comb actuator that forms part of the second layer and two stator comb actuators that respectively form part of the first layer and part of the third layer;
   a mirror suspended on a set of second hinges that are mounted to the gimbal via a set of anchors and that are configured to tilt the mirror about a second axis; and
   a second comb actuator structure associated with a second hinge of the set of second hinges, wherein the second comb actuator structure includes an additional rotor comb actuator that forms part of the third layer and two additional stator comb actuators that respectively form part of the first layer and part of the second layer.

2. The micro-sized mechanical structure of claim 1, wherein the first comb actuator structure is a pure torque comb actuator structure.

3. The micro-sized mechanical structure of claim 1, wherein the second comb actuator structure is a two-stage-stator comb actuator structure.

4. The micro-sized mechanical structure of claim 1, wherein a first stator comb actuator of the two stator comb actuators is associated with a first electrode and a second stator comb actuator of the two stator comb actuators is associated with a second electrode.

5. The micro-sized mechanical structure of claim 1, wherein the two additional stator comb actuators of the second comb actuator structure are bonded together via an oxide layer.

6. The micro-sized mechanical structure of claim 1, wherein the first hinge of the set of first hinges is a two-layer structure with a pivot point that aligns with a mass center of the gimbal.

7. The micro-sized mechanical structure of claim 1, wherein the second hinge of the set of second hinges is a two-layer structure with a pivot point that aligns with a mass center of the mirror.

8. The micro-sized mechanical structure of claim 1, wherein the first comb actuator structure generates electrostatic torque to tilt the gimbal and the mirror about the first axis,
   wherein the first comb actuator structure does not generate any linear electrostatic force.

9. The micro-sized mechanical structure of claim 1, wherein the second comb actuator structure generates electrostatic torque to tilt the mirror about the second axis.

10. The micro-sized mechanical structure of claim 1, wherein the substrate includes an opening to allow the gimbal and the mirror to tilt about the first axis or the mirror to tilt about the second axis.

11. The micro-sized mechanical structure of claim 1, wherein the first layer, the second layer, and the third layer are electrically isolated from each other.

12. The micro-sized mechanical structure of claim 1, wherein the rotor comb actuator of the first comb actuator structure is attached to the gimbal and the two stator comb actuators of the first comb actuator structure are secured to the substrate.

13. The micro-sized mechanical structure of claim 1, wherein the additional rotor comb actuator of the second comb actuator structure is attached to the mirror and the two additional stator comb actuators of the second comb actuator structure are secured to the gimbal.

14. The micro-sized mechanical structure of claim 1, wherein:
   the mirror forms part of the third layer, and
   the first axis is different than the second axis.

15. The micro-sized mechanical structure of claim 7, wherein each layer of the two-layer structure respectively comprises a beam structure of one or more beams.

16. The micro-sized mechanical structure of claim 1, wherein the two stator comb actuators of the first comb actuator structure are electrically isolated from each other.

17. The micro-sized mechanical structure of claim 1, wherein the two additional stator comb actuators of the second comb actuator structure are electrically isolated from each other.

18. A micro-sized mechanical structure comprising:
   a substrate;
   a first layer adjacent to the substrate, a second layer adjacent to the first layer, and a third layer adjacent to the second layer;
   a gimbal suspended on a set of first hinges that are mounted to the substrate and that are configured to tilt the gimbal about a first axis,
      wherein the gimbal forms part of the second layer;
   a first comb actuator structure associated with a first hinge of the set of first hinges,
      wherein the first comb actuator structure includes a rotor comb actuator that forms part of the second layer and two stator comb actuators that respectively form part of the first layer and part of the third layer, and
      wherein the first hinge of the set of first hinges is a two-layer structure comprising:
         a double beam structure on a layer of the two-layer structure of the first hinge, and
         a single beam structure on another layer of the two-layer structure of the first hinge;
   a mirror suspended on a set of second hinges that are mounted to the gimbal via a set of anchors and that are configured to tilt the mirror about a second axis; and
   a second comb actuator structure associated with a second hinge of the set of second hinges,
      wherein the second comb actuator structure includes an additional rotor comb actuator that forms part of the third layer and two additional stator comb actuators that respectively form part of the first layer and part of the second layer.

19. The micro-sized mechanical structure of claim 18, wherein the second comb actuator structure is a two-stage-stator comb actuator structure.

20. The micro-sized mechanical structure of claim 18, wherein the mirror forms part of the third layer.

* * * * *